(12) United States Patent
Fahim

(10) Patent No.: US 6,823,033 B2
(45) Date of Patent: Nov. 23, 2004

(54) ΣΔDELTA MODULATOR CONTROLLED PHASE LOCKED LOOP WITH A NOISE SHAPED DITHER

(75) Inventor: Amr Fahim, Solana Beach, CA (US)

(73) Assignee: Qualcomm Inc., SanDiego, CA (US)

( * ) Notice: Subject to any disclaimer, the term of this patent is extended or adjusted under 35 U.S.C. 154(b) by 98 days.

(21) Appl. No.: 10/199,758

(22) Filed: Jul. 17, 2002

(65) Prior Publication Data

US 2003/0174799 A1 Sep. 18, 2003

Related U.S. Application Data

(60) Provisional application No. 60/363,747, filed on Mar. 12, 2002.

(51) Int. Cl.[7] .................................................. H03D 3/24
(52) U.S. Cl. ....................................... 375/376; 375/327
(58) Field of Search ................................ 375/376, 373, 375/371, 354, 327, 140, 316, 374, 375, 377; 331/1 A, 17; 341/131

(56) References Cited

U.S. PATENT DOCUMENTS

| 5,347,361 | A | | 9/1994 | Kay ............................ 356/350 |
|---|---|---|---|---|
| 5,825,253 | A | | 10/1998 | Mathe et al. .................. 331/18 |
| 5,986,512 | A | | 11/1999 | Eriksson ....................... 331/16 |
| 6,005,888 | A | * | 12/1999 | Barron ......................... 375/140 |
| 6,044,124 | A | * | 3/2000 | Monahan et al. ............ 375/376 |
| 6,175,321 | B1 | | 1/2001 | Frannhagen et al. ........ 341/143 |
| 6,493,376 | B1 | * | 12/2002 | Harms et al. ................ 375/130 |
| 6,577,257 | B2 | * | 6/2003 | Brooks ......................... 341/131 |
| 6,600,378 | B1 | * | 7/2003 | Patana .......................... 331/1 A |
| 6,606,004 | B2 | * | 8/2003 | Staszewski et al. ........... 331/17 |
| 2003/0039330 | A1 | * | 2/2003 | Castiglione et al. ......... 375/376 |

FOREIGN PATENT DOCUMENTS

WO          0307401          3/2003

* cited by examiner

Primary Examiner—Young T. Tse
Assistant Examiner—Sam K. Ahn
(74) Attorney, Agent, or Firm—Philip R Wadsworth; Charles D Brown; Timothy F Loomis

(57) ABSTRACT

This disclosure is directed to a frequency synthesizer for use in a wireless communication device. The frequency synthesizer includes an oscillator, such as a voltage controlled oscillator (VCO) and a ΣΔ-controlled phase-locked loop (PLL) that determines and controls the of the output frequency of the frequency synthesizer. The ΣΔ-controlled PLL may implement a dithering signal generation technique that can reduce or eliminate the introduction of an average frequency offset.

32 Claims, 7 Drawing Sheets

FIG. 5
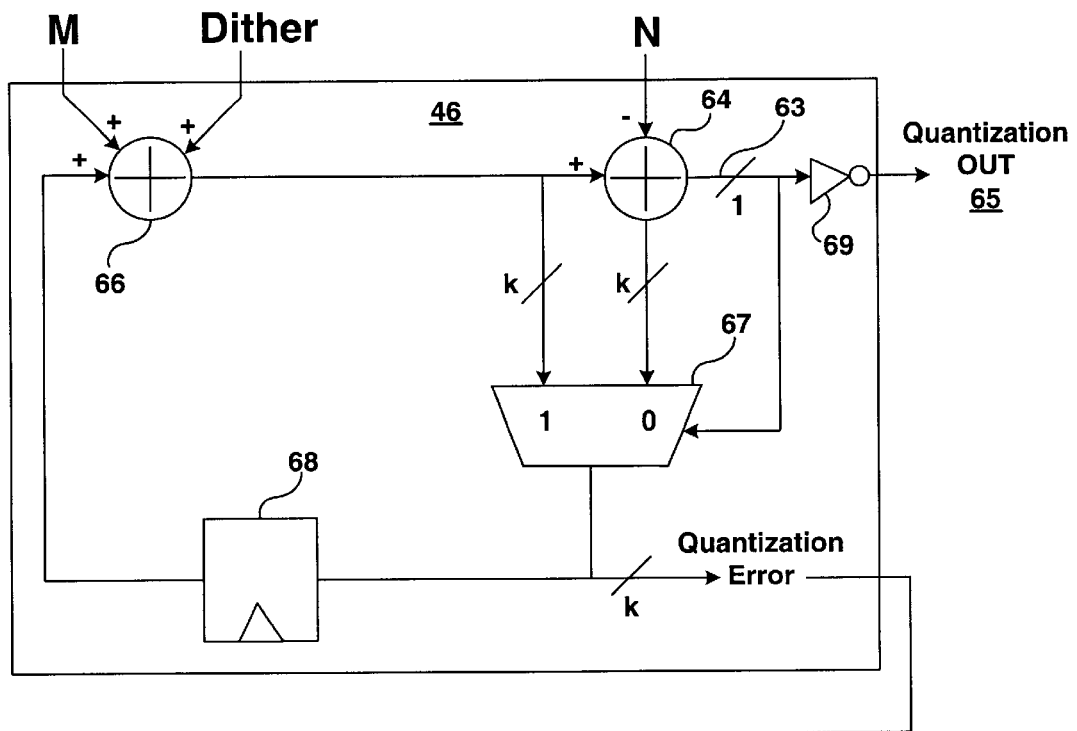
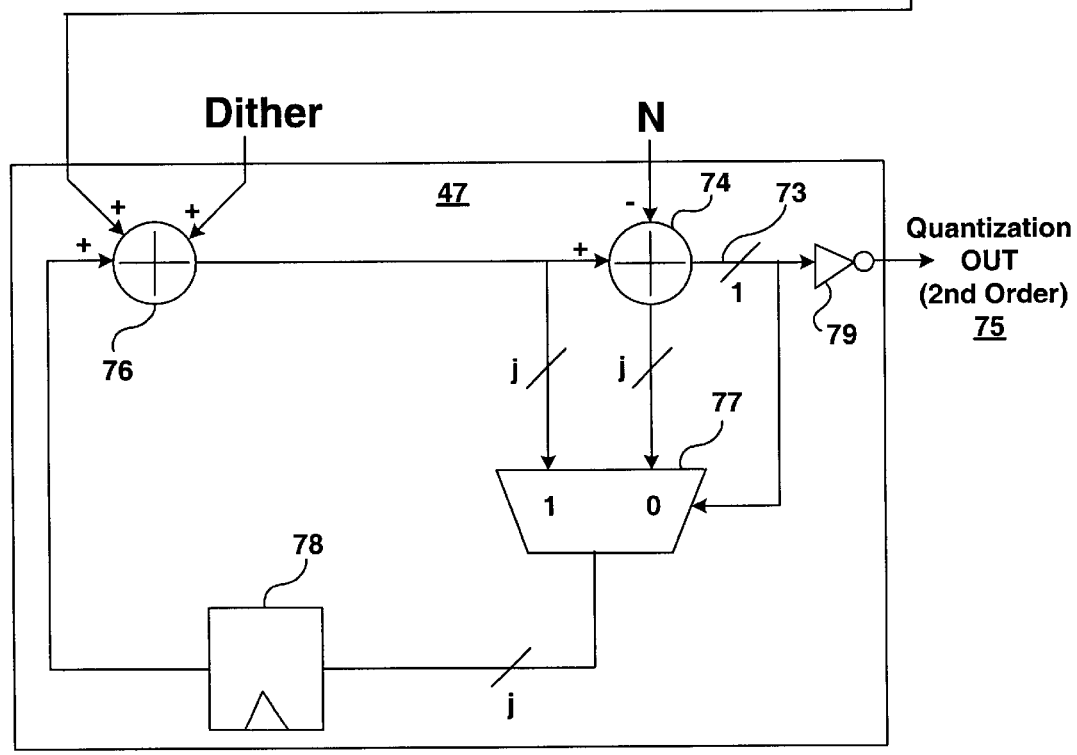

ΣΔDELTA MODULATOR CONTROLLED PHASE LOCKED LOOP WITH A NOISE SHAPED DITHER

RELATED PATENT APPLICATIONS

This application claims the benefit under 35 U.S.C. 119(e) of U.S. Provisional Application No. 60/363,747, filed Mar. 12, 2002.

FIELD

This disclosure relates to frequency synthesizers that can be implemented in wireless communication devices, and more particularly to phase locked loop (PLL) circuits of frequency synthesizers.

BACKGROUND

Frequency synthesizers are commonly implemented within wireless communication devices that transmit and receive encoded radio frequency (RF) signals. A number of different wireless communication techniques have been developed including frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum radio-frequency (RF) signal. Some example wireless communication devices that have incorporated one or more wireless communication techniques include cellular radiotelephones, PCMCIA cards incorporated within portable computers, personal digital assistants (PDAs) equipped with wireless communication capabilities, and the like.

Frequency synthesizers of wireless communication devices may be used during both RF signal reception and RF signal transmission. For example, during RF signal reception of CDMA modulated signals, received RF signals are typically mixed down to baseband signals, which can be converted to digital values. During the mixing down process, reference waveforms are produced by a frequency synthesizer and used to remove the RF carrier component from the received signal. The reference waveforms are sometimes referred to as local oscillator (LO) signals. After mixing the RF signal down to baseband, the baseband signals are typically passed through an analog-to-digital (A/D) converter to produce the digital values that can be tracked and demodulated. For example, a RAKE receiver can be used to track and demodulate multi-path signals of a CDMA system. A number of different CDMA architectures have been developed, such as for example, a heterodyne architecture that includes both an intermediate frequency (IF) section and an RF section, and a Zero IF architecture which converts incoming RF signals directly into baseband signals without first converting the RF signals to IF signals. Depending on the architecture, any number of frequency synthesizers may be implemented to provide reference waveforms to the mixers.

Frequency synthesizers are also used during RF signal transmission. In that case, baseband signals are up-mixed to RF. During the up-mixing process, the frequency synthesizer produces carrier RF waveforms. The carrier waveforms are then mixed with the baseband signal before being transmitted. The frequency synthesizer may include a voltage controlled oscillator (VCO) whose frequency is controlled and adjusted by a phase locked loop (PLL). The timing reference for the PLL is typically a high precision low frequency crystal oscillator, such as a voltage controlled temperature compensated crystal oscillator (VCTCXO).

Phase locked loops (PLLs) generally operate by measuring the output frequency of the VCO, and providing closed loop feedback to the input signal of the VCO. For example, a frequency divider can be used to divide the output signal of the VCO by an integer value. The divided value can then be compared to a higher precision low frequency timing reference. Adjustments can be made to the input voltage applied to the VCO so that the output converges to the desired value.

In order to improve the amount of resolution in a PLL, circuits have been developed that generate fractional division factors, on average. For example, the division factor used by the frequency divider can be generated by a $\Sigma\Delta$ (sigma-delta) modulator. Such a PLL is sometimes referred to as a $\Sigma\Delta$-controlled PLL. The $\Sigma\Delta$ modulator generates different division factors for each iteration of loop, so that on average, a fractional division factor can be represented in the PLL.

In order to avoid repetitive cycles in a $\Sigma\Delta$-controlled PLL, a pseudo-random signal can be introduced to the $\Sigma\Delta$ modulator. This pseudo-random signal is sometimes referred to as a dither or a dithering signal. The introduction of the dithering signal may help ensure that the $\Sigma\Delta$ modulator does not fall into a limit cycle in which the division factors generated by the $\Sigma\Delta$ modulator begin repeating in a cyclical pattern.

SUMMARY

In one embodiment, a frequency synthesizer for use in a wireless communication device is described. For example, the frequency synthesizer may include an oscillator and a $\Sigma\Delta$-controlled phase-locked loop (PLL) that determines and controls the output frequency of the frequency synthesizer.

The $\Sigma\Delta$-controlled PLL may implement a dithering signal generation technique that can reduce or eliminate the introduction of an average frequency offset (also referred to as a dithering offset). In particular, a dithering signal generator may generate a dithering signal from two or more dithering components. At least one of the dithering components may comprise a component used in the generation of a previous dithering signal.

For example, generation of the dithering signal may include generating a new dithering component and subtracting the component used in the generation of the previous dithering signal from the new dithering component. In this manner, the introduction of an average frequency offset can be substantially avoided because each time a new dithering component is introduced, it is subsequently removed in a later clock cycle.

The various embodiments and techniques described in detail below may be implemented in hardware, software, firmware, or any combination thereof. Additional details of these and other embodiments are set forth in the accompanying drawings and the description below. Other features, objects and advantages will become apparent from the description and drawings, and from the claims.

BRIEF DESCRIPTION OF DRAWINGS

FIG. 5 is a block diagram of an exemplary M-N accumulator that can form part of a $\Sigma\Delta$ modulator.

DETAILED DESCRIPTION

Figure 1:
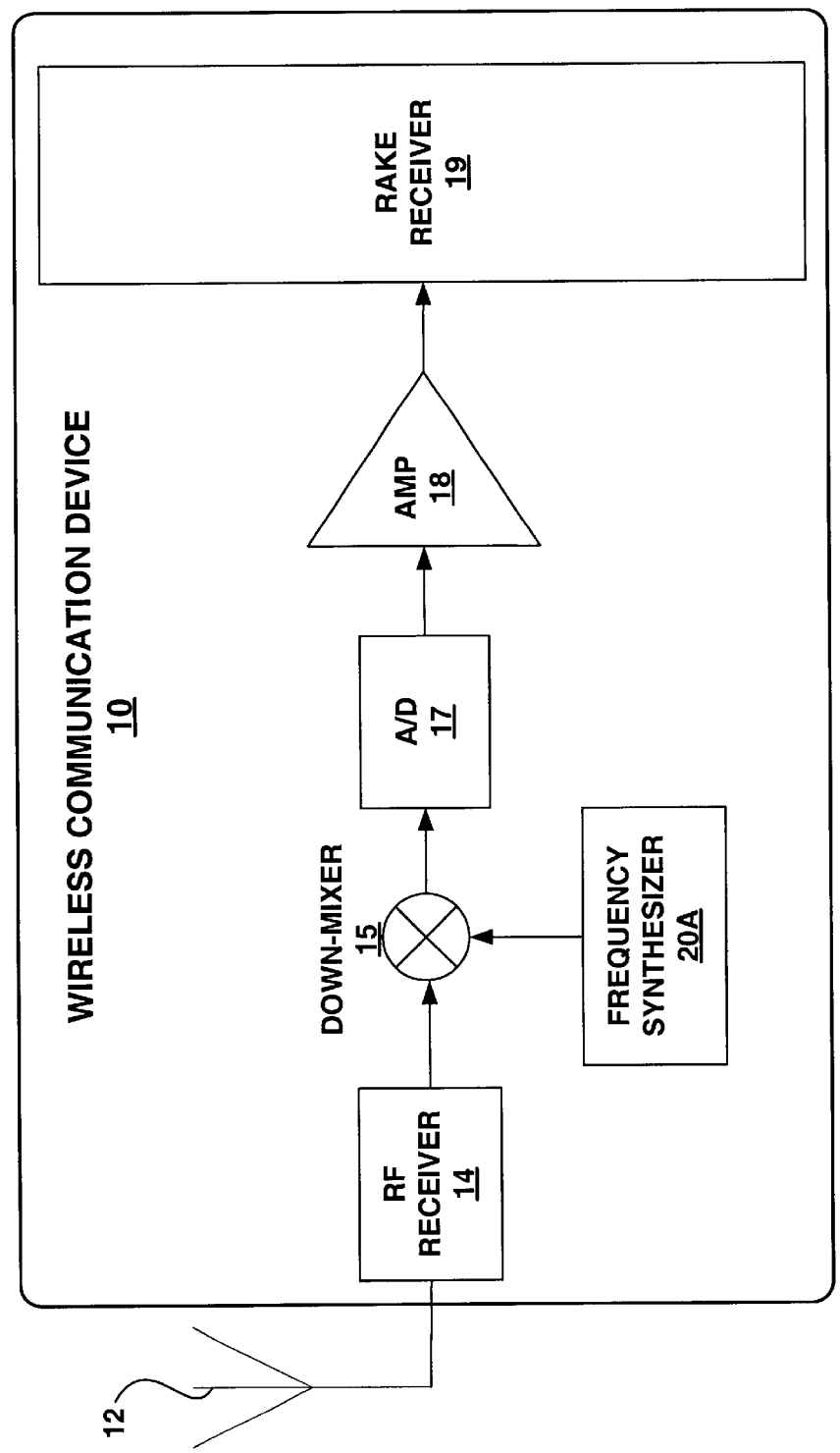
FIG. 1 is a block diagram of a wireless communication device implementing a frequency synthesizer for RF signal reception.

In general, this disclosure is directed to a frequency synthesizer for use in a wireless communication device. The frequency synthesizer includes an oscillator, such as a voltage controlled oscillator (VCO) and a phase-locked loop (PLL) that determines and controls the output frequency of the frequency synthesizer. The PLL includes a variable divider that divides the output of the VCO by different integer values over time such that the average division factor of the divider is a fractional value. The divided output of the VCO is then compared to a higher precision reference frequency so that errors in the VCO can be detected and adjustments to the VCO frequency can be made.

The PLL implements a $\Sigma\Delta$ modulator in order to generate division factors that vary over time. Such a PLL is sometimes referred to as a $\Sigma\Delta$-controlled PLL. The $\Sigma\Delta$ modulator generates different division factors for each iteration of the PLL so that, on average, a fractional division factor can be represented in the PLL. The $\Sigma\Delta$ modulator receives integer values representing the numerator and denominator of the fractional portion of the division factor as well as a pseudo-random signal, sometimes referred to as a dither or a dithering signal. The $\Sigma\Delta$ modulator may accumulate these values to quantize the fractional portion of the division factor for each clock cycle. The introduction of the dithering signal may help ensure that the $\Sigma\Delta$ modulator does not fall into a limit cycle in which the division factors generated by the $\Sigma\Delta$ modulator begins repeating in a cyclical pattern.

The introduction of the dithering signal, however, on average, may result in the introduction of an average frequency offset (also referred to herein as a dithering offset or an average dithering value), which can undermine the effectiveness of the $\Sigma\Delta$-controlled PLL, particularly when used in wireless communication devices that operate according to code division multiple access CDMA standards or other standards that require very precise frequency accuracy. For this reason, in accordance with the principles of this disclosure, a dithering signal generator that provides the dithering signals to the $\Sigma\Delta$ modulator is configured to generate dithering signals that have an average value of approximately zero.

More specifically, the dithering signal generator outlined in greater detail below, outputs signals that are created from the difference between a newly generated dithering signal component and a previously generated dithering signal component used in a previous clock cycle. In other words, the dithering signal introduced to the $\Sigma\Delta$ modulator includes at least two components: a new dithering component and a subtracted dithering component that serves to cancel the offset introduced by the new dithering component of a previous clock cycle. In this manner, a dithering signal can be provided to the $\Sigma\Delta$ modulator to avoid limit cycles, i.e., cycles in which the division factors generated by the $\Sigma\Delta$ modulator begin repeating in a cyclical pattern. However, on average, the frequency offset caused by the introduction of dithering signals may be approximately zero because after each new dithering signal component is introduced, it is then removed in a subsequent clock cycle. In this manner, the performance of a $\Sigma\Delta$-controlled PLL can be improved. Accordingly, implementation of a frequency synthesizer having a $\Sigma\Delta$-controlled PLL can be realized in systems that operate according to one or more CDMA standards or other standards such as GSM (Global System for Mobile Communications) that require very precise frequency accuracy.

Figure 2:
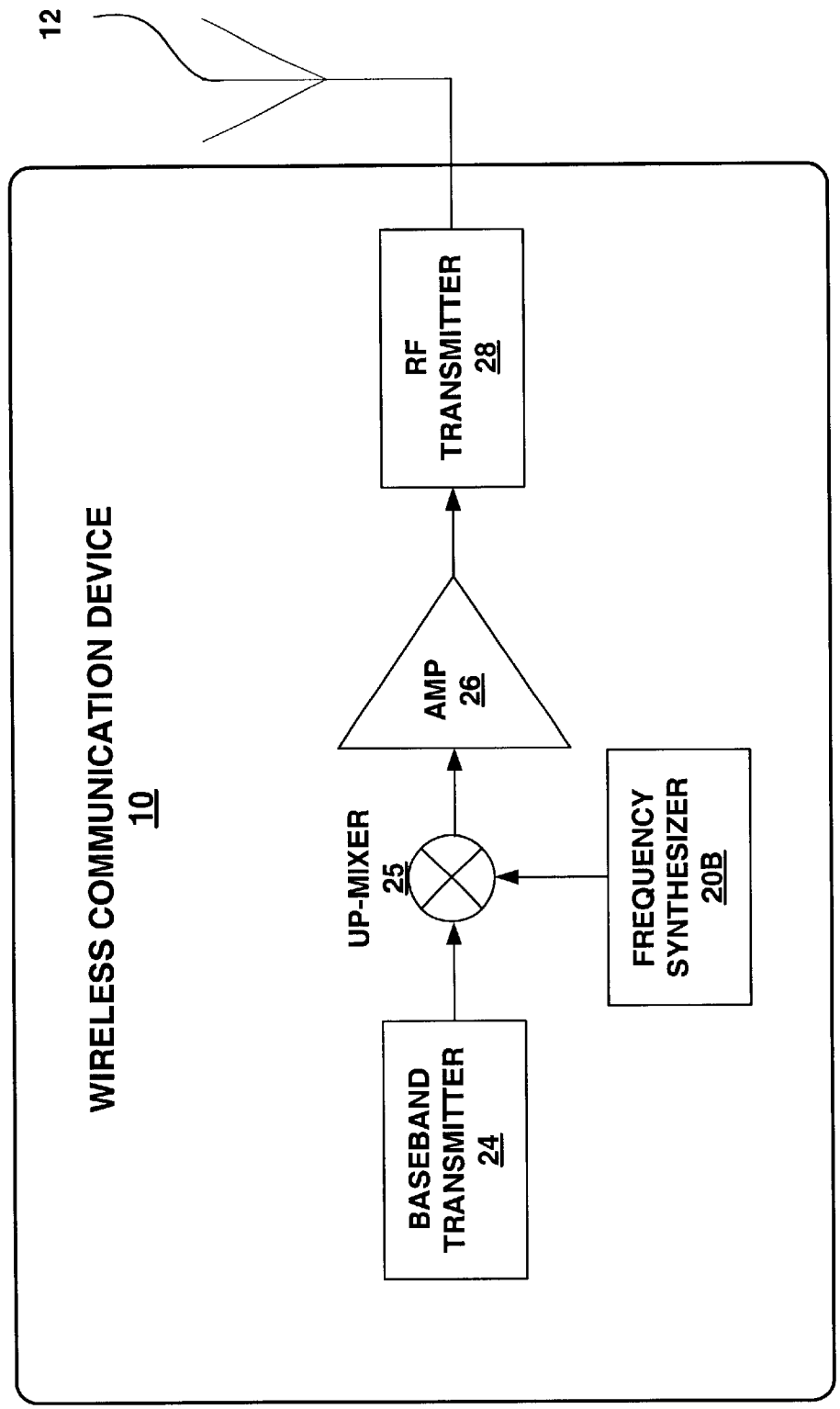
FIG. 2 is a block diagram of a wireless communication device implementing a frequency synthesizer for RF signal transmission.

FIGS. 1 and 2 are block diagrams of a wireless communication device 10 incorporating frequency synthesizers 20A and 20B, respectively. Frequency synthesizer 20A operates for RF signal reception, whereas frequency synthesizer 20B operates for RF signal transmission. Frequency synthesizers 20A, 20B may be substantially identical in structure and operation, and in some cases may be the same frequency synthesizer used for both RF signal transmission and reception. Frequency synthesizers 20A and 20B will be referred to herein as frequency synthesizer 20. Whether it is used in reception or transmission, frequency synthesizer 20 may implement one or more of the techniques outlined below to improve operation of the wireless communication device 10.

The block diagram of FIG. 1 illustrates an exemplary wireless communication device (WCD) 10 implementing the Zero IF architecture, although this disclosure is not limited in that respect. In a Zero IF architecture, WCD 10 converts incoming RF signals directly into baseband signals and, specifically, does not first convert the RF signals to intermediate frequency (IF) signals. It is understood, however, that the techniques described herein may be readily applicable to any architecture that implements one or more frequency synthesizers.

WCD 10 includes antenna 12 that receives incoming RF signals. For example, the incoming RF signals may comprise code division multiple access (CDMA) modulated signals sent from a CDMA base station, although this disclosure is not limited in that respect. An RF signal received by antenna 12 can be processed by RF receiver 14, e.g., by passing the signal through a low-noise amplifier (LNA) and one or more filters. The RF signal is then mixed down to baseband by down-mixer 15. In particular, down-mixer 15 may receive reference waveforms produced by frequency synthesizer 20A. Frequency synthesizer 20A may implement a $\Sigma\Delta$-controlled PLL, as described herein, to control the frequency of the output signal with improved resolution. In particular, the described ΣΔ-controlled PLL can substantially eliminate the introduction of a dithering offset which could otherwise impact the performance of frequency synthesizer 20A.

Down mixer 15 produces baseband signals which can be filtered and sampled by analog to digital (A/D) converter 17 to produce corresponding digital values of the signals. RAKE receiver 19 may receive the digital values to separate and track signals received from different sources, e.g., different base stations of a wireless communication system. As desired, WCD 10 may also include additional components such as filters, amplifiers, and various other digital or analog signal processing components (not shown).

FIG. 2 is another block diagram of WCD 10, illustrating components implemented during RF signal transmission. In the example of FIG. 2, baseband transmitter 24 may generate and forward baseband signals to up-mixer 25. Frequency synthesizer 20B provides carrier RF waveforms to up-mixer 25. Again, frequency synthesizer 20B implements a ΣΔ-controlled PLL, to control the frequency of the output signal with improved resolution and improved accuracy. Frequency synthesizer 20B may be substantially identical to frequency synthesizer 20A (FIG. 1), or may have a slightly different structure or operation than that used for signal reception.

Up-mixer 25 mixes the baseband signal onto the RF carrier and forwards the mixed RF signal to amplifiers 26 for scaling. Amplifiers 26 may include one or more voltage gain amplifiers (VGAs), driver amplifiers (DAs), and power amplifiers (PAs). Once the mixed RF signal has been adequately amplified or attenuated, RF transmitter 28 may transmit the RF signal from wireless communication device 10 via antenna 12.

Figure 3:
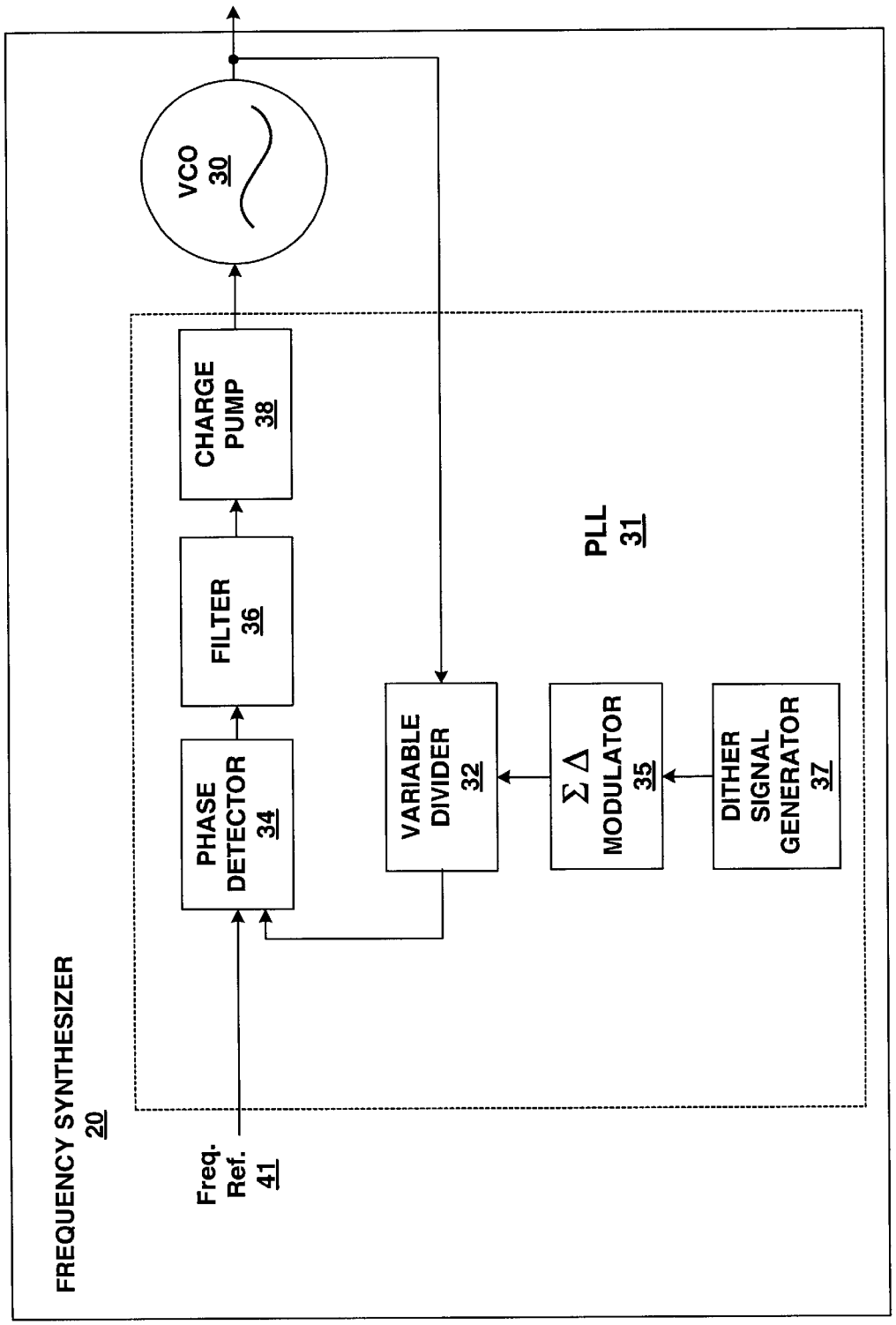
FIG. 3 is a an exemplary frequency synthesizer such as shown in FIG. 1 or 2.

FIG. 3 is a more detailed block diagram of frequency synthesizer 20 according to an exemplary embodiment. Frequency synthesizer 20 corresponds to either of synthesizers 20A or 20B shown respectively in FIGS. 1 and 2. As shown in FIG. 3, frequency synthesizer 20 may comprise an oscillator such as a voltage controlled oscillator (VCO) 30 that interacts with a ΣΔ-controlled PLL 31. For example, PLL 31 may provide analog closed-loop control of the output frequency of VCO 30 by controlling an input control voltage that is applied to the VCO 30.

PLL 31 may include a number of components, including, for example, variable divider 32, a phase detector 34, a loop filter 36, and a charge pump 38. In addition, PLL 31 may include a dithering signal generator 37 that provides dithering signals to a ΣΔ modulator 35. The ΣΔ modulator 35 can generate the integer values used by variable divider 32 for each clock cycle. A sequence of integer division factors provided from ΣΔ modulator 35 to variable divider 32 can be used to represent an average division factor that includes a fractional portion.

Variable divider 32 can scale the output frequency of VCO 30 by the integer values provided by ΣΔ modulator 35 so that phase detector 34 can determine the frequency difference between a reference frequency 41 and the scaled VCO output. By way of example, the reference frequency 41 may be provided by a temperature compensated crystal oscillator (TCXO) that is a higher-precision, lower-frequency oscillator than VCO 30. Once phase detector 34 has determined the frequency difference between the scaled VCO frequency and the reference frequency, the frequency difference can be filtered by filter 36. Filter 36 may comprise a low pass filter and may account for fractional spikes in frequency which can be introduced when variable divider 32 switches between division factors.

The loop filter 36 should be chosen to have an order equal to or greater than the order of the ΣΔ modulator 35. In particular, if ΣΔ modulator 35 is a second order ΣΔ modulator as outlined in greater detail below, then a second order loop filter 36 may be chosen. Similarly, if ΣΔ modulator 35 is a third order ΣΔ modulator, then a third order loop filter 36 may be chosen. Charge pump 38 receives a signal indicative of the frequency error detected in the output of VCO 30, and adjusts the input voltage to VCO 30 as needed, to either increase or decrease the oscillating frequency of VCO 30.

Variable divider 32 divides the output of VCO 30 by different integer values over time such that the average division factor of the divider is a fractional value. In other words, variable divider 32 periodically switches between two or more division factors so that improved resolution can be achieved. For example, if the desired division factor is 10.2 (10 and 1/5), then variable divider 32 may switch between the division factor of 11 and the division factor of 10 so that the average division factor over time is equal to approximately 10.2.

In particular, to achieve a desired division factor of 10.2, variable divider 32 may divide by the division factor of 10 for four cycles, and then divide by the division factor of 11 for one cycle. In that case, after five cycles, the average division factor would be (10*4+11)/5=10.2. ΣΔ modulator 35 may receive the integer value of 10 as well as the fractional numerator 1 and fractional denominator 5, and can generate a sequence of integers to be provided to variable divider 32 to generate a division factor of 10 and 1/5, on average. In addition, dithering signal generator 37 can provide dithering signals to ΣΔ modulator 35 to improve randomization of the sequence of integers that average the desired division factor. Moreover, dithering signal generator 37 may noise-shape the dithering signal so that the transfer function associated with the dithering signal after being introduced to ΣΔ modulator 35 is one. In other words, the transfer function of dithering signal generator 37 can be the inverse of the transfer function of accumulators within ΣΔ modulator 35 so that the overall transfer function associated with dithering signals is one.

Variable divider 32 may be implemented using a wide variety of different hardware configurations, including multiplier circuits, divider circuits, shift registers, counters, and the like. In one configuration, divider 32 includes counters that count the leading or trailing edges of oscillator pulses, and provide a signal each time an integer number of pulses is detected. Again, the integer division factor is controlled by the output of ΣΔ modulator 35, and may switch over time depending on the input provided to ΣΔ modulator 35.

In some cases, another divider (not shown) may also be implemented to divide reference frequency 41. In that case, the additional divider may be similar to variable divider 32, possibly receiving signals from another ΣΔ modulator which is coupled to another dithering signal generator. In other words, the principles described herein may be extended for use with other frequency dividers, or possibly other circuits where the introduction of dithering signals is useful.

Figure 4:
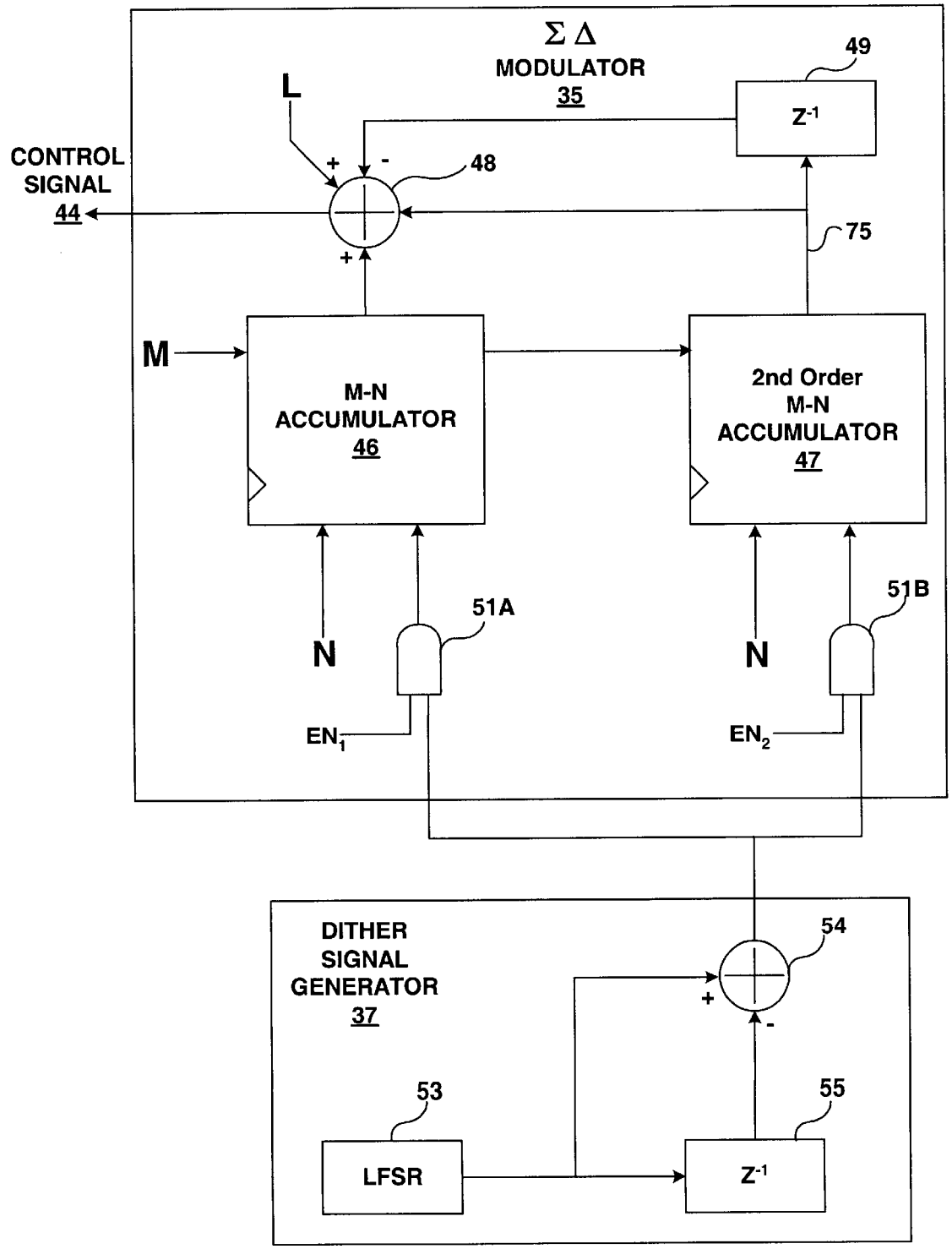
FIG. 4 is a block diagram of an exemplary $\Sigma\Delta$ modulator coupled to a dither signal generator.

FIG. 4 is a block diagram of an exemplary ΣΔ modulator 35 coupled to a dither signal generator 37. Such an implementation is exemplary, as the functionality outlined in this disclosure could also be implemented using lookup tables (LUTs), or alternative accumulator configurations. In addition, although ΣΔ modulator 35 is illustrated as a second order ΣΔ modulator, the principles of this disclosure could be extended for use in higher order ΣΔ modulators.

In general, ΣΔ modulator 35 receives values L, M and N, which quantify a desired fractional division factor to be generated on average, for application by variable divider 32. L represents the integer portion of the desired division factor, M represents the numerator of the fractional portion of the desired division factor, and N represents the denominator of the fractional portion of the desired division factor. For example, if the desired division factor is 10 and 5/6 (10.833333), then L=10, M=5, and N=6. The values of L, M and N may be constant or adjustable, and may be programmed into ΣΔ modulator 35 or provided as input during operation.

ΣΔ modulator 35 receives the values of L, M, and N, processes the values over a number of clock cycles, and outputs a control signal 44 to variable divider 43 for each clock cycle. The control signal 44 may be an integer division factor, that varies with each clock cycle such that an average division factor is substantially equal to a desired division factor. For example, if L=10, M=5, and N=6, then ΣΔ modulator 35 may output control signals over six clock cycles in which the control signal for five of the clock cycles indicate a division factor of 11 and the control signal for one of the six clock cycles indicates a division factor of 10. Thus, over the six clock cycles, the average division factor provided to variable divider 32 would be (11*5+10)/6= 10.833333, i.e., 10 and 5/6. In addition, the introduction of a dithering signal can substantially randomize the sequence of division factors that average the desired division factor. Randomization of the sequence is desirable to ensure that ΣΔ modulator does not generate the division factors in a cyclical manner.

In the configuration illustrated in FIG. 4, ΣΔ modulator 35 includes first order M-N accumulator 46 and second order M-N accumulator 47. Both M-N accumulators 46 and 47 operate in parallel. In particular, M-N accumulator 46 performs an accumulation to quantize the fractional portion of the division factor M/N, and M-N accumulator 47 performs another accumulation to quantize the error associated with the results generated by M-N accumulator 46. For each clock cycle, combiner 48 adds the value L to the value generated by M-N accumulator 46 and the value generated by M-N accumulator 47 for that clock cycle, and subtracts from the control signal, the value generated by M-N accumulator 47 for the preceding clock cycle. In this manner, combiner 48 generates control signal 44 for each clock cycle. A clocked register 49 (sometimes referred to as a flip-flop, or a flop) can be used to store the output of M-N accumulator 47 for each clock cycle so that it can be subtracted by combiner 48 in the subsequent clock cycle.

In order to randomize each respective sequence of control signals generated by ΣΔ modulator 35, a dithering signal can be introduced to M-N accumulators 46, 47. For example, if a six clock cycle sequence of control signals comprising five signals corresponding to a division factor of 11 and one control signal corresponding to a division factor of 10 are desired, it may nevertheless be undesirable to generate the sequence in a repetitive fashion. Rather, the operation of frequency synthesizer 20 can be improved by randomizing each six clock cycle sequence so that the division factors applied by variable divider 32 do not fall into a cyclical limit cycle.

For this reason, dithering signal generator 37 can be used to generate the dithering signals applied in ΣΔ modulator 35. ΣΔ modulator 35 may include AND gates 51A and 51B that receive enabling signals ($EN_1$ and $EN_2$) when the use of the dithering signals generated by dithering signal generator 37 is desired.

Dithering signal generator 37 is specifically designed to generate the dithering signal in a manner that can greatly improve operation of frequency synthesizer 20. In particular, dithering signal generator generates dithering signals that, on average, sum to an approximately zero value. Thus, dithering signal generator 37 substantially avoids the introduction of a frequency offset (dithering offset) to frequency synthesizer 20.

For example, dithering signal generator 37 may create each dithering signal by combining two dithering components. A first dithering corresponds to a dithering component that was added to a previous dithering signal during a previous clock cycle, and a second dithering component comprises a newly generated dithering component. For example, for each clock cycle, a linear feedback shift register (LSFR) 53 can generate the new dithering component. Subtractor 54 subtracts from the new dithering component, the dithering component that LSFR 53 generated during a previous clock cycle. Clocked register 55 can be used to store the output of LSFR 53 for each clock cycle so that it can be subtracted during generation of the dithering signal of the subsequent clock cycle. The amount of delay may also be adjusted, as desired. In other words, the previous dithering component subtracted from the new dithering component may correspond to a component generated X clock cycles before the generation of the new dithering component, where X is an integer.

As each new dithering component is added to generate a dithering signal, the same component is subsequently subtracted in a subsequent clock cycle, to negate the effect of that component on the average dithering value, i.e., the dithering offset introduced to frequency synthesizer 20. In other words, dithering signal generator 37 generates a first dithering signal by subtracting a first dithering component from a second dithering component, and during a subsequent clock cycle, dithering signal generator 37 generates a second dithering signal by subtracting the second dithering component from a third dithering component. Thus, the effect of the second dithering component of the first dithering signal on an average dithering value is negated by an effect of the second dithering component of the second dithering signal on the average dithering value.

Similarly, dithering signal generator 37 can generate a third dithering signal by subtracting the third dithering component from a fourth dithering component. The effect of the third dithering component of the second dithering signal on the average dithering value is negated by an effect of the third dithering component of the third dithering signal on the average dithering value. Additionally, dithering signal generator 37 can generate a fourth dithering signal by subtracting the fourth dithering component from a fifth dithering component. In this manner, the effect of the fourth dithering component of the third dithering signal on the average dithering value is negated by an effect of the fourth dithering component of the fourth dithering signal on the average dithering value, and so forth. Hence, the overall effect of the introduction of dithering signals can be negated by the subsequent introduction of other dithering signals. When a one-clock-cycle delay is used, with each passing cycle, only the most recently added new dithering component may contribute to the offset. Larger delays may result in two or more dithering components contributing to the offset at any given instance. In any case, however, the average offset can be said to be approximately zero because the introduction of dithering signals is negated by the subsequent introduction of other dithering signals.

Another benefit of the configuration illustrated in FIG. 4, is that the transfer function associated with the generation of the dithering signal is an inverse of a transfer function associated with the generation of the division factor. More specifically, the transfer function associated with dithering signal generator 37 is an inverse of the transfer function associated with M-N accumulators 46, 47. In the illustrated example of FIG. 4, the transfer function of dithering signal generator 37 is $(1-Z^{-1})$, whereas the transfer function of M-N accumulator 46, 47 is $1/(1-Z^{-1})$. By configuring the transfer functions to be the inverse of one another, the collective transfer function of both dithering signal generator 37 and $\Sigma\Delta$ modulator 35 is approximately equal to one, i.e., a unity transfer function. Therefore, the overall transfer function associated with the introduction of a dithering signal is one.

Alternatively, in other configurations the transfer function of the dithering signal generator 37 may be $(1-Z^{-1})^2$, e.g. if the transfer function of MN accumulators was $1/(1-Z^{-1})^2$. In general, the transfer function of dithering signal generator 37 may be $1/(1-Z^{-k})^n$, where k and n are integers. In any case, the transfer function dithering signal generator 37 can be chosen to be the inverse of the transfer function of M-N accumulator 46, 47 so that the overall transfer function associated with the introduction of a dithering signal is one, i.e., a unity transfer function.

FIG. 5 is a block diagram illustrating an exemplary configuration of M-N accumulators 46 and 47. As shown, accumulator 46 accumulates in steps of M (plus the dither), until the accumulated value becomes greater than N. Again, the introduction of the dither can randomize the sequence of division factors generated by $\Sigma\Delta$ modulator 35 (FIG. 4).

With each clock cycle, another value of M is accumulated. If the accumulated value does not exceed N (as defined by the value of overflow signal 63), then a zero value is quantized as the output 65. More specifically, subtractor 64 subtracts the input value N (which corresponds to the denominator of the fractional portion of the desired division factor) from the result of adder 66 (which corresponds to the current accumulation in increments of M). If N is larger than the current accumulation, then substractor 64 generates an overflow signal of one, which is inverted to generate output 65. In addition, overflow signal 63 is used by multiplexer 67 to select the current accumulation to update register 68. The contents of register 68 are then summed with the value M by adder 66 during the subsequent clock cycle. By way of example, subtractor 64 may generate overflow signal 63 very quickly by examining the most significant bit of the twos-complement of the result of subtractor 64.

The overflow signal 63 serves to quantize the fractional portion of the division factor. As long as N is greater than the accumulated value (which is accumulated in steps of M), signal 63 is a one, which is inverted by inverter 69 to generate a zero quantization value for the fractional portion of the division factor. However, as soon as the accumulated value exceeds N, signal 63 becomes zero, which is inverted by inverter 69 to generate a quantization of one for the fractional portion of the division factor. Referring again to FIG. 4, the output of M-N accumulator 46 is added to the integer portion of the division factor (L) to generate control signal 44.

M-N accumulator 47 operates in an analogous manner to the operation of M-N accumulator 47 described above. In particular, combiner 76 operates analogous to combiner 66, substractor 74 operates analogously to subtractor 64, multiplexer 77 operates analogously to multiplexer 67, register 78 operates analogously to register 68, overflow signal 73 is generated in an analogous manner to the generation of overflow signal 63, and inverter 79 operates analogously to inverter 69.

However, unlike M-N accumulator 46 which receives input M, $2^{nd}$ order M-N accumulator 47 receives as input, the output of multiplexer 67 of accumulator 46, which also represents the error associated with the quantization of output signal 65 of accumulator 46 for each clock cycle. Thus, M-N accumulator 47 serves to correct for second order quantization effects. As illustrated in FIG. 4, the output 75 of $2^{nd}$ order M-N accumulator 47 is added to the control signal 44 by combiner 48, and is also stored in register 49 to be subtracted by combiner 48 in the next clock cycle. As desired, even higher order M-N accumulators could also be added to provide even more precision in the division factor generated by $\Sigma\Delta$ modulator 35. Alternatively, similar output to that of M-N accumulators 46 and 47 may be generated using one or more look-up tables to quantize input variables over a sequence of clock cycles to define a desired fractional division factor, on average.

Figure 6:
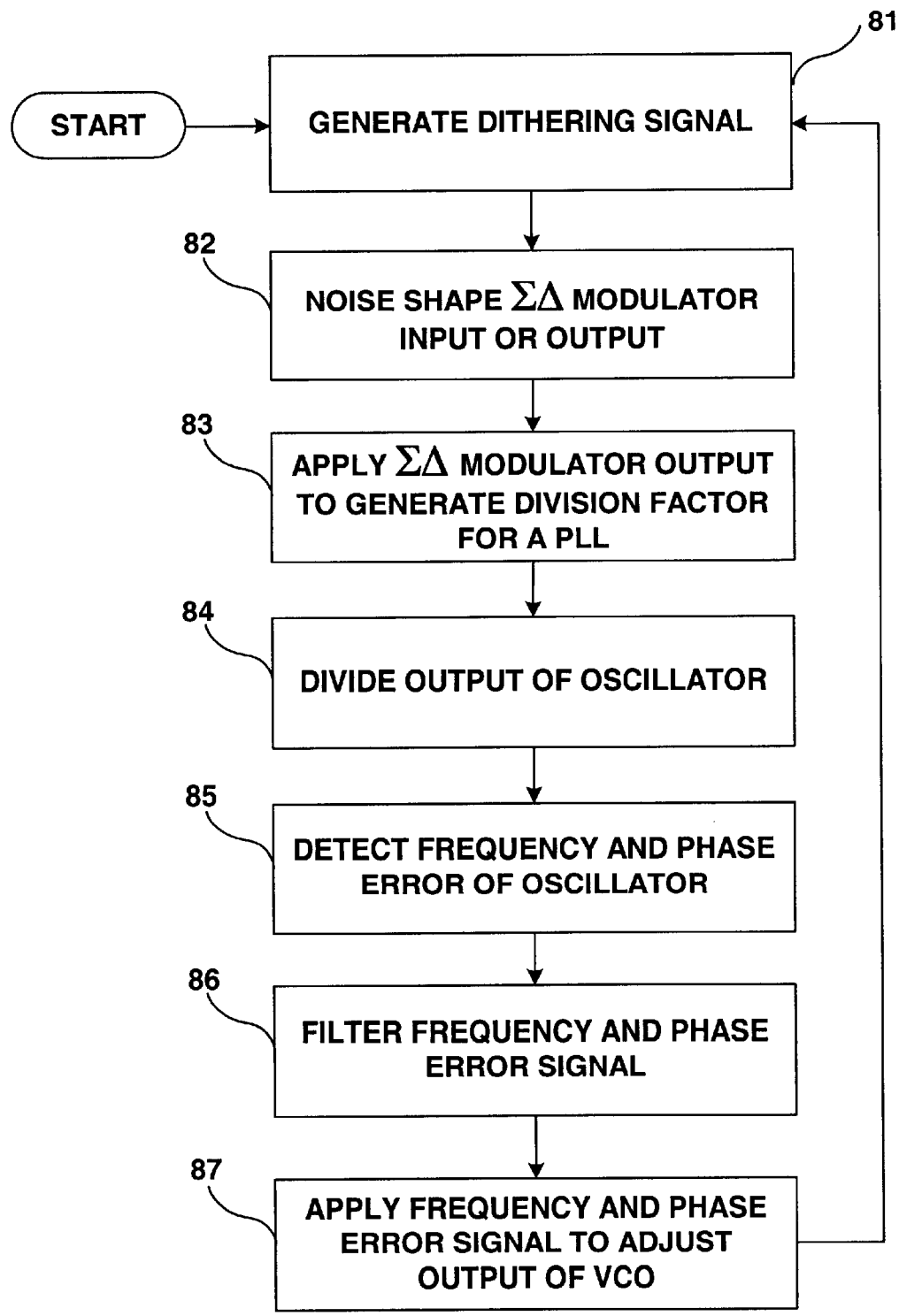
FIGS. 6 and 7 are flow diagrams illustrating techniques consistent with the principles of this disclosure.

FIG. 6 is a flow diagram illustrating a technique consistent with the principles of this disclosure. As shown, a dithering signal generator 37 of a phase locked loop 31 generates dithering signals (81) such that over the course of a number of iterations of the phase locked loop 31, a dithering offset is approximately equal to zero. $\Sigma\Delta$ modulator 35 receives the noise shaped dithering signal as well as values indicative of a division factor to be generated, and generates an output which is noise shaped (82). In particular, the output of $\Sigma\Delta$ modulator 35 may be noise shaped such that a transfer function associated with M-N accumulators 46, 47 is the inverse of a transfer function associated with dithering signal generator 37. Variable divider 32 applies the output of ΣΔ modulator 35 to select a division ratio (83), and divides an output of oscillator 30 by the division ratio (84). Phase detector 34 compares the divided value received from variable divider 32 to a reference frequency 41 to detect a frequency error and/or phase error associated with oscillator 30 (85). Loop filter 36 filters an error signal generated by phase detector 34 (86), and applies the error signal, which is a voltage, to adjust the output of the voltage controlled oscillator 30 (87). Additionally, charge pump 38 may be used to create the desired input voltage to voltage controlled oscillator 30 based on the error signal.

The process may continue in a closed-loop fashion during operation of frequency synthesizer 20 in order to improve the frequency synthesis of synthesizer 20. In particular, the frequency synthesis process can be improved by the use of a dithering signal generated from two or more dithering components such that an average dithering offset introduced by dithering signal generator 37 is approximately zero.

Figure 7:
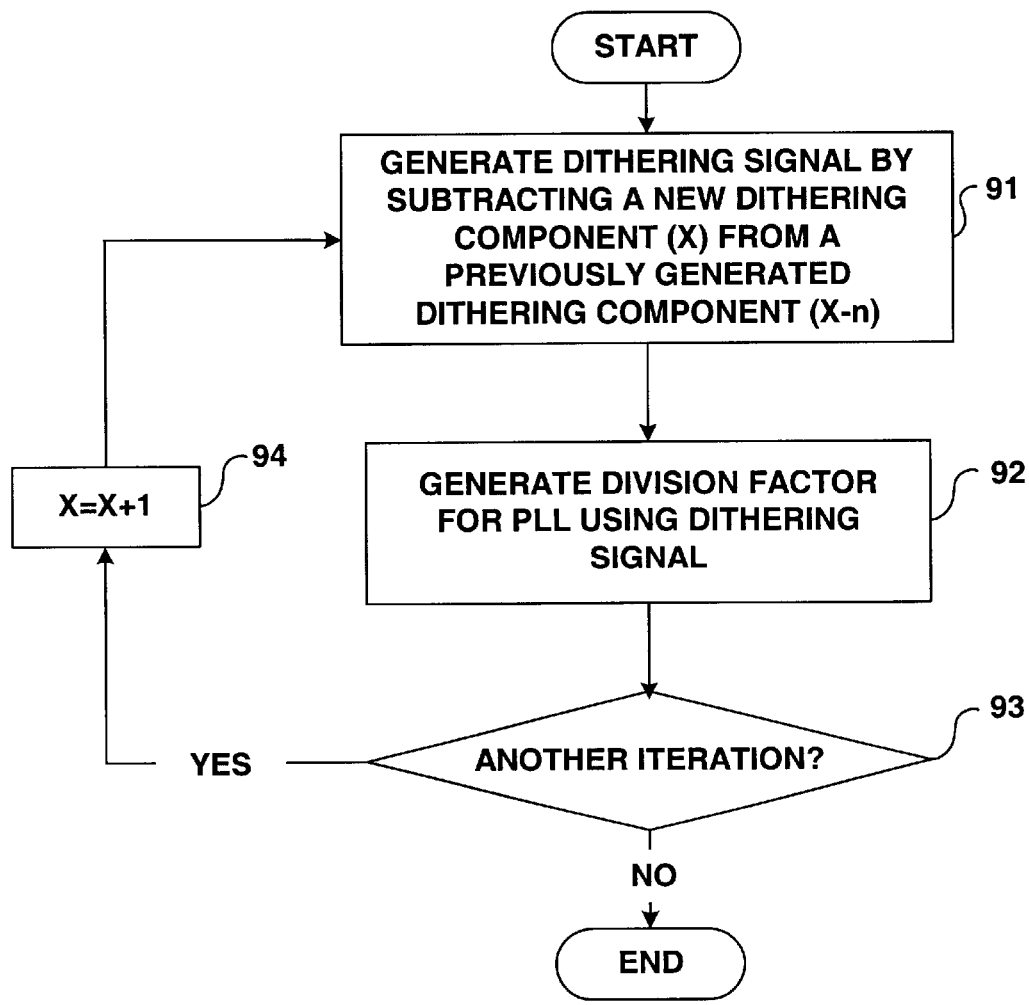

FIG. 7 is another flow diagram illustrating a technique consistent with the principles of this disclosure. As shown, dithering signal generator 37 of a phase locked loop 31 generates dithering signals by subtracting a new dithering component X from a previously generated dithering component X-n (91). The integer n may correspond to a clock cycle delay, and may be chosen to be one or larger. If n=1, then each new dithering signal includes a subtracted component that corresponds to a component of the immediately preceding dithering signal, i.e., a dithering signal generated in the previous clock cycle. If n=2, then each new dithering signal includes a subtracted component that corresponds to a component of the dithering signal generated two clock cycles before new dithering signal, and so forth.

After dithering signal generator 37 generates the dithering signal (91) ΣΔ modulator 35 uses the dithering signal to generate a division factor for a PLL (92). ΣΔ modulator 35 may receive the dithering signal as well as values indicative of a division factor to be generated, and may generate the division factor based on these inputs. The process may continue in a looped fashion to generate division factors for subsequent iterations of the PLL (as shown by yes branch of 93). The value X is illustrated as being incremented (94) with each iteration to illustrate the generation of a new dithering component with each passing clock cycle.

A number of embodiments have been described. For example, ΣΔ-controlled PLL has been described which implements a dithering signal generation technique that can reduce or eliminate the introduction of a dithering offset. Nevertheless various modifications can be made without departing from the scope of this disclosure. For example, the ΣΔ modulator may be implemented using look-up tables stored in memory, rather than using M-N accumulators as outlined in FIGS. 4 and 5. In addition, a higher order ΣΔ modulator may be used, rather than a second order ΣΔ modulator such as that illustrated in FIG. 4. For example, a third order M-N accumulator could be added, or alternatively, a set of look-up tables adding third order precision to the ΣΔ modulator could be used. Even higher orders could also be represented, although the added level of precision introduced by fourth order accumulators or larger, for example, may be relatively small.

Also, one of more of the techniques described above may be implemented in devices other that a wireless communication device. Moreover, the same or similar techniques may be used with oscillators other than voltage controlled oscillators. For example, similar techniques may be may be used to adjust current controlled oscillators, and the like. Furthermore, although many detailed aspects of the various embodiments have been described as being implemented in hardware, the same or similar techniques may be implemented in software, firmware, or various combinations of hardware, software and firmware. Accordingly, these and other embodiments are within the scope of the following claims.

What is claimed is:

1. A method comprising:
   generating a dithering signal from two or more dithering components, at least one of the dithering components including a component used in the generation of a previous dithering signal; and
   generating a division factor for use in a phase locked loop of a frequency synthesizer based at least in part on the generated dithering signal by accumulating the generated dithering signal with input signals indicative of a fractional portion of an average division factor to quantize a fractional portion of the generated division factor.

2. The method of claim 1, wherein generating the division factor further includes summing the quantized fractional portion of the division factor with a non-fractional portion of the division factor.

3. The method of claim 1, wherein a transfer function associated with the generation of the dithering signal is an inverse of a transfer function associated with accumulating the generated dithering signal with said input signals.

4. A method comprising:
   generating a first dithering signal by subtracting a first dithering component from a second dithering component; and
   generating a second dithering signal by subtracting the second dithering component from a third dithering component, such that an effect of the second dithering component of the first dithering signal on an average dithering value is negated by an effect of the second dithering component of the second dithering signal on the average dithering value.

5. The method of claim 4, further comprising generating a third dithering signal by subtracting the third dithering component from a fourth dithering component, such that an effect of the third dithering component of the second dithering signal on the average dithering value is negated by an effect of the third dithering component of the third dithering signal on the average dithering value.

6. The method of claim 5, further comprising generating a fourth dithering signal by subtracting the fourth dithering component from a fifth dithering component, such that an effect of the fourth dithering component of the third dithering signal on the average dithering value is negated by an effect of the fourth dithering component of the fourth dithering signal on the average dithering value.

7. The method of claim 6, further comprising:
   generating division factors for use in a phase locked loop of a frequency synthesizer, wherein generating the division factors includes applying the generated dithering signals; and
   applying the division factors in the phase locked loop of the frequency synthesizer.

8. The method of claim 4, wherein generating the second dithering signal occurs an integer number of clock cycles after generating the first dithering signal.

9. A frequency synthesizer comprising:
an oscillator; and
a phase locked loop that controls a frequency of an oscillating signal of the oscillator, the phase locked loop including:
a dithering signal generator that generates a dithering signal from two or more dithering components, at least one of the dithering components including a component used in the generation of a previous dithering signal;
a modulator what generates a division factor based at least in part on the generated dithering signal; and
a divider that applies the division factor 1,
wherein the modulator generates the division factor by accumulating the generated dithering signal with input signals indicative of a fractional portion of an average division factor to quantize a fractional portion of the division factor.

10. The frequency synthesizer of claim 9, wherein the modulator further generates the division factor by summing the quantized fractional portion of the division factor with a non-fractional portion of the division factor.

11. The frequency synthesizer of claim 9, wherein a transfer function associated with the generation of the dithering signal is an inverse of a transfer function associated with the accumulated dithering signal with input signals.

12. The frequency synthesizer of claim 9, wherein the divider applies the division factor in the phase locked loop by dividing an oscillating signal of the oscillator by the division factor.

13. The frequency synthesizer of claim 12, wherein the phase locked loop further comprises:
a phase detector that compares the divided oscillating signal to a reference frequency;
a loop filter that filters a result of the comparison; and
a charge pump that applies an input voltage to the oscillator based on the result of the comparison.

14. A frequency synthesizer comprising:
an oscillator; and
a phase locked loop that controls a frequency of an oscillating signal of the oscillator, the phase locked loop including a dithering signal generator that generates a first dithering signal by subtracting a first dithering component from a second dithering component, and generates a second dithering signal by subtracting the second dithering component from a third dithering component, and a modulator producing an effect of the second dithering component of the first dithering signal on an average dithering value is negated by an effect of the second dithering component of the second dithering signal on the average dithering value.

15. The frequency synthesizer of claim 14, wherein the dithering signal generator generates a third dithering signal by subtracting the third dithering component from a fourth dithering component, such that an effect of the third dithering component of the second dithering signal on the average dithering value is negated by an effect of the third dithering component of the third dithering signal on the average dithering value.

16. The frequency synthesizer of claim 15, wherein the dithering signal generator generates a fourth dithering signal by subtracting the fourth dithering component from a fifth dithering component, such that an effect of the fourth dithering component of the third dithering signal on the average dithering value is negated by an effect of the fourth dithering component of the fourth dithering signal on the average dithering value.

17. The frequency synthesizer of claim 16, wherein the phase locked loop further includes:
a modulator that generates division factors, wherein the modulator applies the generated dithering signals during generation of the division factors; and
a divider divides the division factors.

18. A wireless communication device comprising:
a frequency synthesizer including an oscillator and a phase locked loop that controls a frequency of an oscillating signal of the oscillator, wherein the phase locked loop includes:
a dithering signal generator that generates a dithering signal from two or more dithering components, at least one of the dithering components including a component used in the generation of a previous dithering signal;
a modulator that generates a division factor based at least in part on the generated dithering signal; and
a divider that applies the division factor in the phase locked loop of the frequency synthesizer; and
a mixer that mixes waveforms using the oscillating signal of the oscillator,
wherein the dithering signal generator generates the dithering signal by subtracting the component used in the generation of the previous dithering signal from a new dithering component, and wherein the modulator generates the division factor by accumulating the generated dithering signal with input signals indicative of a fractional portion of an average division factor to quantize a fractional portion of the division factor and summing the quantized fractional portion of the division factor with a non-fractional portion of the division factor.

19. The wireless communication device of claim 18, further comprising a receiver that receives RF waveforms, wherein the mixer down-mixes the received RF waveforms to a baseband signal using the oscillating signal generated by the frequency synthesizer.

20. The wireless communication device of claim 18, further comprising a transmitter that transmits the waveforms, wherein the mixer mixes the waveforms by modulating baseband signals onto the oscillating signal generated by the frequency synthesizer to create the waveforms prior to transmission.

21. The wireless communication device of claim 18, wherein the device is selected from the group consisting of: a personal digital assistant, a laptop computer, a desktop computer, a cellular radiotelephone, and a satellite radiotelephone.

22. A wireless communication device comprising:
a frequency synthesizer including an oscillator, and a phase locked loop that controls a frequency of an oscillating signal of the oscillator, the phase locked loop including a dithering signal generator that generates a first dithering signal by subtracting a first dithering component from a second dithering component, and generates a second dithering signal by subtracting the second dithering component from a third dithering component, and a modulator producing an effect of the second dithering component of the first dithering signal on an average dithering value is negated by an effect of the second dithering component of the second dithering signal on the average dithering value; and a mixer that mixes waveforms using the oscillating signal of the oscillator.

23. The wireless communication device of claim 22, further comprising a receiver that receives RF waveforms, wherein the mixer down-mixes the received RF waveforms to a baseband signal using the waveforms generated by the frequency synthesizer.

24. The wireless communication device of claim 22, further comprising a transmitter that transmits the waveforms, wherein the mixer mixes the waveforms by modulating baseband signals onto the oscillating signal generated by the frequency synthesizer to create the waveforms prior to transmission.

25. An apparatus comprising:

a first set of digital circuitry that generates a dithering signal from two or more dithering components, at least one of the dithering components including a component used in the generation of a previous dithering signal;

a second set of digital circuitry that generates a division factor based at least in part on the generated dithering signal; and a third set of digital circuitry that applies the division factor in a phase locked loop of a frequency synthesizer, wherein the second set of circuitry generates the division factor by accumulating the generated dithering signal with input signals indicative of a fractional portion of an average division factor to quantize a fractional portion of the division factor.

26. The apparatus of claim 25, wherein the second set of circuitry further generates the division factor by summing the quantized fractional portion of the division factor with a non-fractional portion of the division factor.

27. The apparatus of claim 25, wherein a transfer function associated with the generation of the dithering signal is an inverse of a transfer function associated with the accumulated dithering signal with input signals.

28. A frequency synthesizer comprising:

an oscillator; and means for controlling a frequency of an oscillating signal of the oscillator, wherein the means for controlling includes:

means for generating a first dithering signal by subtracting a first dithering component from a second dithering component; and means for generating a second dithering signal by subtracting the second dithering component from a third dithering component, and a modulator producing an effect of the second dithering component of the first dithering signal on an average dithering value is negated by an effect of the second dithering component of the second dithering signal on the average dithering value.

29. The frequency synthesizer of claim 28, wherein the means for controlling further includes:

means for generating division factors based at least in part on the generated dithering signals;

means for applying the division factors to divide the oscillating signal of the oscillator;

means for detecting a frequency error in the oscillating signal based on a comparison of the divided oscillating signal and a reference frequency; and means for adjusting an input to the oscillator based on the comparison.

30. A method comprising:

generating a series of dithering signals for application in a phase locked loop, each dithering signal being generated by combining two or more dithering components, at least one of the dithering components including a component used in the generation of a previous dithering signal; and selecting the dithering signals such that an average dithering value introduced in the phase locked loop is approximately zero.

31. An article of manufacture comprising:

a computer usable medium having computer readable program code means for generating a dithering signal and a computer readable program code means for generating a division factor embodied therein, the computer readable program code means in said article of manufacture comprising:

computer readable program code means for generating a dithering signal from two or more dithering components, at least one of the dithering components including a component used in the generation of a previous dithering signal; and computer readable program code means for generating a division factor for use in a phase locked loop of a frequency synthesizer based at least in part on the generated dithering signal by accumulating the generated dithering signal with input signals indicative of a fractional portion of an average division factor to quantize a fractional portion of the generated division factor.

32. A program storage device readable by a machine, tangibly embodying a program of instructions executable by the machine to perform method steps comprising:

generating a dithering signal from two or more dithering components, at least one of the dithering components including a component used in the generation of a previous dithering signal; and generating a division factor for use in a phase locked loop of a frequency synthesizer based at least in part on the generated dithering signal by accumulating the generated dithering signal with input signals indicative of a fractional portion of an average division factor to quantize a fractional portion of the generated division factor.

* * * * *